(12) United States Patent
Lai et al.

(10) Patent No.: US 11,450,258 B2
(45) Date of Patent: Sep. 20, 2022

(54) DISPLAY PANEL AND DISPLAY DEVICE

(71) Applicant: Xiamen Tianma Micro-Electronics Co., Ltd., Xiamen (CN)

(72) Inventors: Qingjun Lai, Xiamen (CN); Yihua Zhu, Xiamen (CN); Jinjin Yang, Xiamen (CN); Ping An, Xiamen (CN)

(73) Assignee: Xiamen Tianma Micro-Electronics Co., Ltd., Xiamen (CN)

(*) Notice: Subject to any disclaimer, the term of this patent is extended or adjusted under 35 U.S.C. 154(b) by 0 days.

(21) Appl. No.: 17/528,138

(22) Filed: Nov. 16, 2021

(65) Prior Publication Data

US 2022/0076604 A1    Mar. 10, 2022

(30) Foreign Application Priority Data

May 14, 2021    (CN) .......................... 202110530361.7

(51) Int. Cl.
*G09G 3/20*    (2006.01)
*G11C 19/28*    (2006.01)

(52) U.S. Cl.
CPC .............. *G09G 3/20* (2013.01); *G11C 19/287* (2013.01); *G09G 2300/0809* (2013.01); *G09G 2310/0286* (2013.01); *G09G 2310/08* (2013.01)

(58) Field of Classification Search
CPC ............. G09G 3/20; G09G 2300/0809; G09G 2310/0286; G09G 2310/08; G11C 19/287
See application file for complete search history.

(56) References Cited

U.S. PATENT DOCUMENTS

2019/0237034 A1*    8/2019    Hao ..................... G09G 3/3614
2019/0237036 A1*    8/2019    Kurihara ........... G02F 1/136286

* cited by examiner

*Primary Examiner* — Sejoon Ahn
(74) *Attorney, Agent, or Firm* — Kilpatrick Townsend & Stockton, LLP

(57) ABSTRACT

Provided are a display panel and a display device. The display panel includes a driving circuit comprising N stages of cascaded shift registers. Each shift register includes a first control unit, a second control unit, a third control unit, and a fourth control unit. The first control unit is configured to receive an input signal and control a signal of a first node. The second control unit is configured to receive a first voltage signal and control a signal of a second node. The third control unit is configured to receive a signal of a fourth node and control an output signal, or receive a second voltage signal and control the output signal. The fourth control unit is configured to receive the first voltage signal and a third voltage signal and control the signal of the fourth node.

20 Claims, 10 Drawing Sheets

DISPLAY PANEL AND DISPLAY DEVICE

CROSS-REFERENCE TO RELATED APPLICATION

This application claims priority to Chinese Patent Application No. 202110530361.7 filed May 14, 2021, the disclosure of which is incorporated herein by reference in its entirety.

FIELD

Embodiments of the present disclosure relate to display technologies and, in particular, to a display panel and a display device.

BACKGROUND

With the development of display technologies, more and more electronic devices with the display function are widely applied to people's daily life and work, bringing great convenience to people's daily life and work.

A display panel is a main component of an electronic device for implementing the display function. A scanning driving circuit in the display panel outputs a drive signal, and the drive signal is transmitted to a pixel circuit in a pixel array by using a gate line and other signal lines so that the pixel array may be controlled to display a picture. In the related art, the driving circuit generally includes multiple cascaded shift registers. While a previous-stage shift register transmits an output signal as a scanning signal to the gate line, the previous-stage shift register transmits the output signal as an input signal to a next-stage shift register so that the next-stage shift register is controlled to output a scanning signal.

However, the output signal output by the existing shift register is prone to instability, which not only affects the stability of the output signals of the subsequent cascaded shift registers, but also affects the display effect of the entire pixel array.

SUMMARY

In view of this, the present disclosure provides a display panel and a display device, to solve the problem of the unstable output signal output by the shift register in the display panel.

In one embodiment of the present disclosure provides a display panel. The display panel includes a driving circuit including N stages of cascaded shift registers, where N≥2.

Each shift register includes a first control unit, a second control unit, a third control unit, and a fourth control unit.

The first control unit is configured to receive an input signal and control a signal of a first node in response to a first clock signal.

The second control unit is configured to receive a first voltage signal and control a signal of a second node in response to at least the input signal and the signal of the first node.

The third control unit is configured to receive a signal of a fourth node and control an output signal in response to the signal of the second node, or receive a second voltage signal and control the output signal in response to a signal of a third node, where the third node is connected to the first node, the first voltage signal is a high level signal, and the second voltage signal is a low level signal.

The fourth control unit is configured to receive the first voltage signal and a third voltage signal and control the signal of the fourth node in response to at least the signal of the second node, where the third voltage signal is a low level signal.

In the case where the output signal is a low level signal, a potential of the signal of the fourth node is lower than or equal to a potential of the output signal.

In one embodiment of the present disclosure further provides a display device. The display device includes the display panel described in the embodiments.

In the display panel and the display device provided in embodiments of the present disclosure, a first control unit receives an input signal and controls a signal of a first node in response to a first clock signal; a second control unit receives a first voltage signal and controls a signal of a second node in response to the input signal and the signal of the first node; a third control unit receives a signal of a fourth node and controls an output signal in response to the signal of the second node, or the third control unit receives a second voltage signal and controls the output signal in response to a signal of a third node. Since a potential of the fourth node may affect the output signal, a fourth control unit receives the first voltage signal and a third voltage signal and controls the signal of the fourth node in response to the signal of the second node. In this manner, when the output signal is at a low level, a potential of the signal of the fourth node is lower than or equal to a potential of the output signal and is not higher than a potential of the output signal, so that when the output signal is a low level signal, no leakage current flowing to an output signal terminal exists, the stability of the output signal can be ensured, and thus the stability of the output signals of the subsequent cascaded shift registers and the display effect of the display panel can be ensured; moreover, the following problem can be avoided: when the output signal is a high level signal, the signal of the fourth node is a high level signal, and when the output signal jumps to a low level, the signal of the fourth node is still maintained as a high level signal, so that the fourth node has a leakage current flowing to the output signal terminal, that is, the high level signal of the fourth node raises the output signal, causing the instable output of the low level signal.

DETAILED DESCRIPTION

Figure 1:
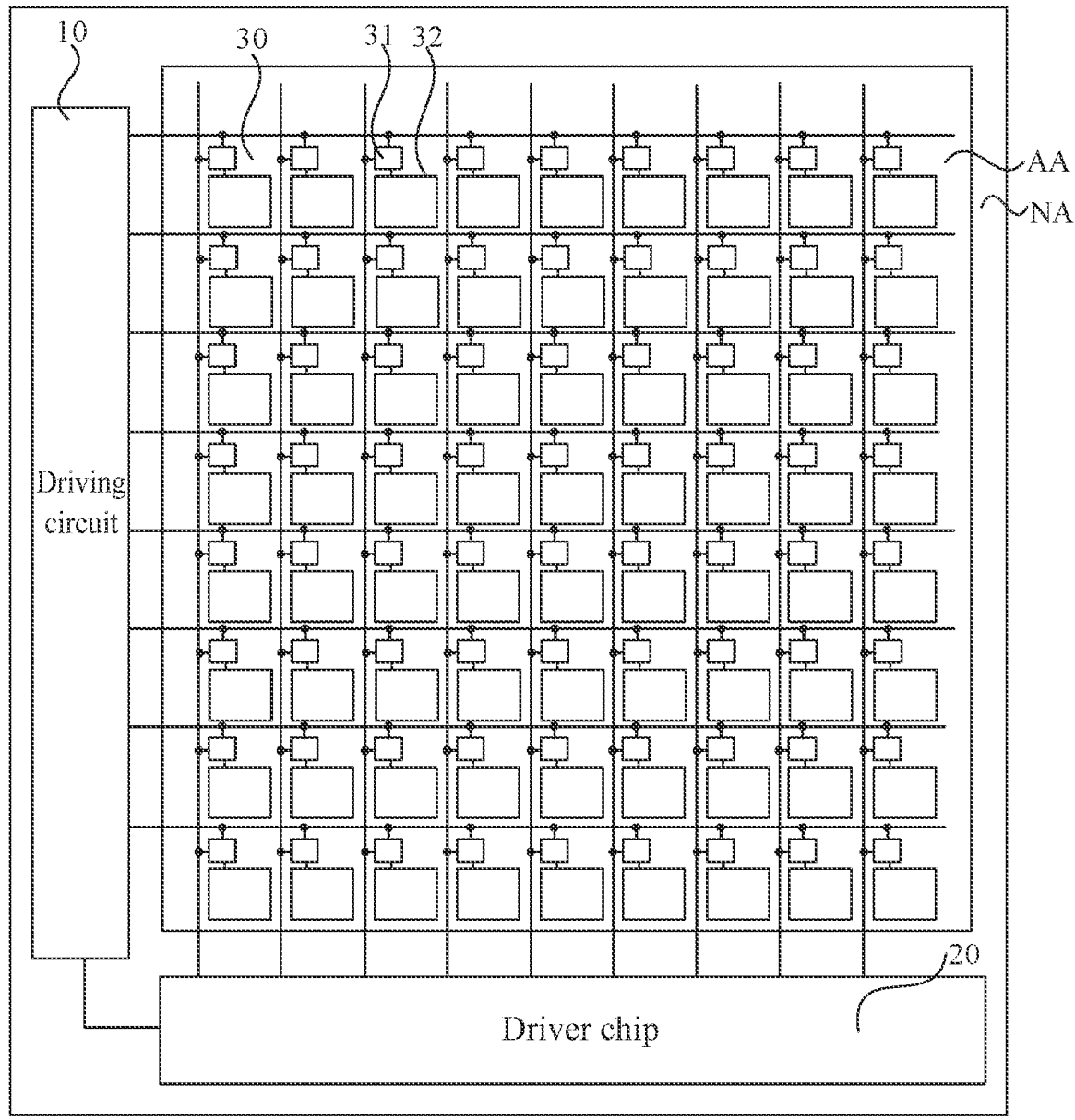
FIG. 1 is a structure diagram of a display panel according to an embodiment of the present disclosure.

The present disclosure is further described hereinafter in detail in conjunction with drawings and embodiments. It is to be understood that embodiments described hereinafter are intended to explain the present disclosure and not to limit the present disclosure. Additionally, it is to be noted that for ease of description, only part, not all, of structures related to the present disclosure are illustrated in the drawings.

In view of the problem mentioned in BACKGROUND, embodiments of the present disclosure provide a display panel and a display device. The display panel includes a driving circuit. The driving circuit includes N stages of cascaded shift registers, where N≥2. Each shift register includes a first control unit, a second control unit, a third control unit, and a fourth control unit. The first control unit is configured to receive an input signal and control a signal of a first node in response to a first clock signal. The second control unit is configured to receive a first voltage signal and control a signal of a second node in response to at least the input signal and the signal of the first node. The third control unit is configured to receive a signal of a fourth node and control an output signal in response to the signal of the second node, or the third control unit is configured to receive a second voltage signal and control the output signal in response to a signal of a third node, where the third node is connected to the first node, the first voltage signal is a high level signal, and the second voltage signal is a low level signal. The fourth control unit is configured to receive the first voltage signal and a third voltage signal and control the signal of the fourth node in response to at least the signal of the second node, where the third voltage signal is a low level signal. When the output signal is a low level signal, a potential of the signal of the fourth node is lower than or equal to a potential of the output signal.

According to the embodiments, when the output signal is a low level signal, it is ensured that the signal of the fourth node is lower than or equal to the output signal and is not higher than the output signal, so that when the output signal is a low level signal, no leakage current flowing to an output signal terminal exists, the stability of the output signal can be ensured, and thus the stability of the output signals of the subsequent cascaded shift registers and the display effect of the display panel can be ensured.

Embodiments of the present disclosure are described clearly and completely below in conjunction with the drawings in embodiments of the present disclosure. Apparently, the embodiments described below are part, not all, of embodiments of the present disclosure.

Figure 2:
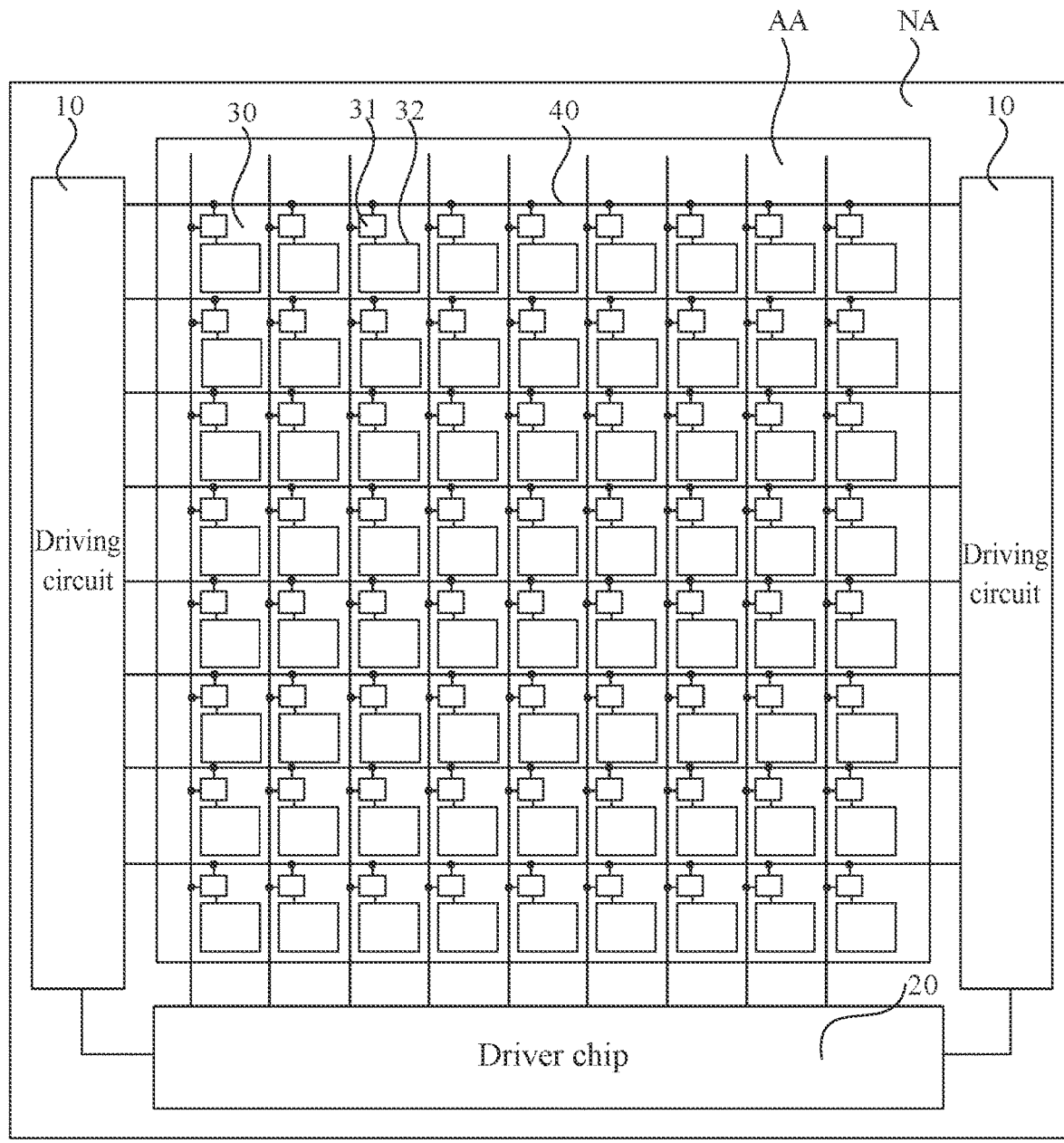
FIG. 2 is a structure diagram of another display panel according to an embodiment of the present disclosure.

FIG. 1 is a structure diagram of a display panel according to an embodiment of the present disclosure. As shown in FIG. 1, the display panel provided in embodiment of the present disclosure includes a driving circuit 10 and multiple pixels 30. Each pixel 30 includes a pixel circuit 31 and a light-emitting element 32. The driving circuit 10 is electrically connected to the pixel circuit 31 through a signal line and provides a drive signal for the pixel circuit 31 so that the pixel circuit 31 drives the light-emitting element 32 to emit light, and thus the effect of displaying a picture is achieved. In an embodiment, the display panel further includes a driver chip 20. The driver chip 20 is electrically connected to the driving circuit 10 through a signal line and provides the driving circuit 10 with a signal required for the normal operation of the driving circuit 10. The signal may be, for example, an input signal, a first clock signal, a first voltage signal, a second voltage signal, a third voltage signal, and the like. The subsequent content of these signals will be described in detail and will not be repeated here. In an embodiment, the display panel further includes a display region AA and a non-display region NA, the driving circuit 10 and the driver chip 20 are located in the non-display region NA, and the pixels 30 are located in the display region AA. The driving circuit 10 may be located on the left side of the display region AA as shown in FIG. 1. However, the position of the driving circuit 10 is not limited to this. Some embodiments may set the position of the driving circuit 10 in the display panel according to actual conditions. For example, driving circuits 10 may also be disposed on two opposite sides of the display region AA as shown in FIG. 2. In the case where the driving circuits 10 are disposed on two opposite sides of the display region AA, the driving circuits 10 on two sides simultaneously provide corresponding signals for signal lines. For example, in the case where the signal lines are scanning signal lines 40, the driving circuits 10 on two sides simultaneously output scanning signals to the scanning signal lines 40 so that the following case can be avoided: the voltage drop on the scanning signal lines 40 exist and thus the display effect of the display panel is affected.

Figure 3:
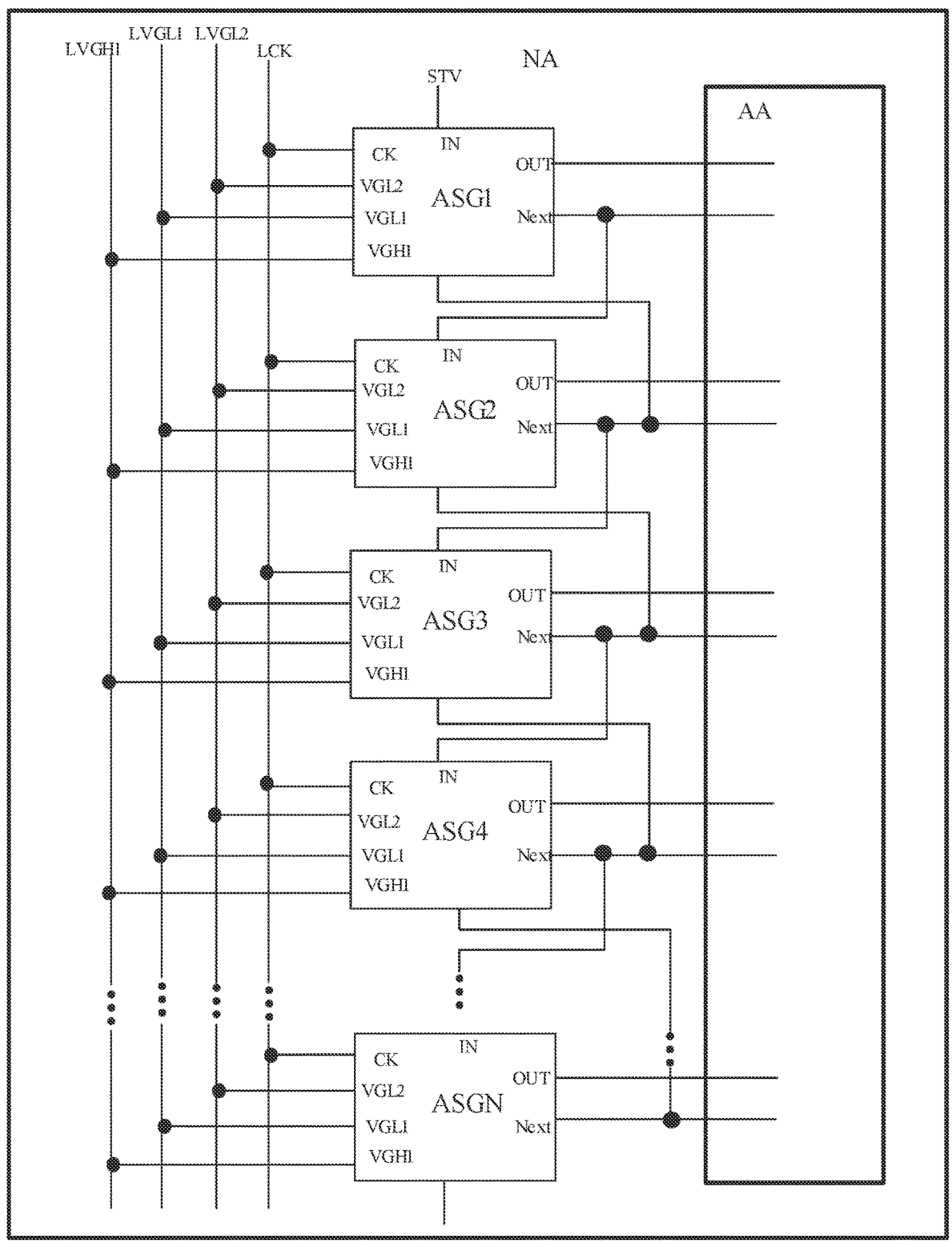
FIG. 3 is a structure diagram of a driving circuit according to an embodiment of the present disclosure.

FIG. 3 is a structure diagram of a driving circuit according to an embodiment of the present disclosure. As shown in FIG. 3, in the embodiment of the present disclosure, the driving circuit 10 includes N stages of cascaded shift registers. For example, the driving circuit 10 may include N shift register units ASG1 to ASGn, where N≥2, and the specific value of N may be set according to actual conditions and is not limited herein. An output terminal OUT of a previous-stage shift register is connected to an input terminal IN of a next-stage shift register. For example, the output terminal OUT of the shift register ASG1 is connected to the input terminal IN of the next-stage shift register ASG2; the output terminal OUT of the shift register ASG2 is connected to the input terminal IN of the next-stage shift register ASG3, and so on. In this manner, the output signal output by the output terminal OUT1 of the previous-stage shift register, i.e., a scanning signal, as an input signal is input to the input terminal IN of the next-stage shift register. For example, the input signal IN of a first-stage shift register may be provided by the driver chip 20. It is to be noted that, in FIG. 3, only the case where N shift registers are cascaded in one manner is used as an example for description, and it is not limited to this.

Figure 4:
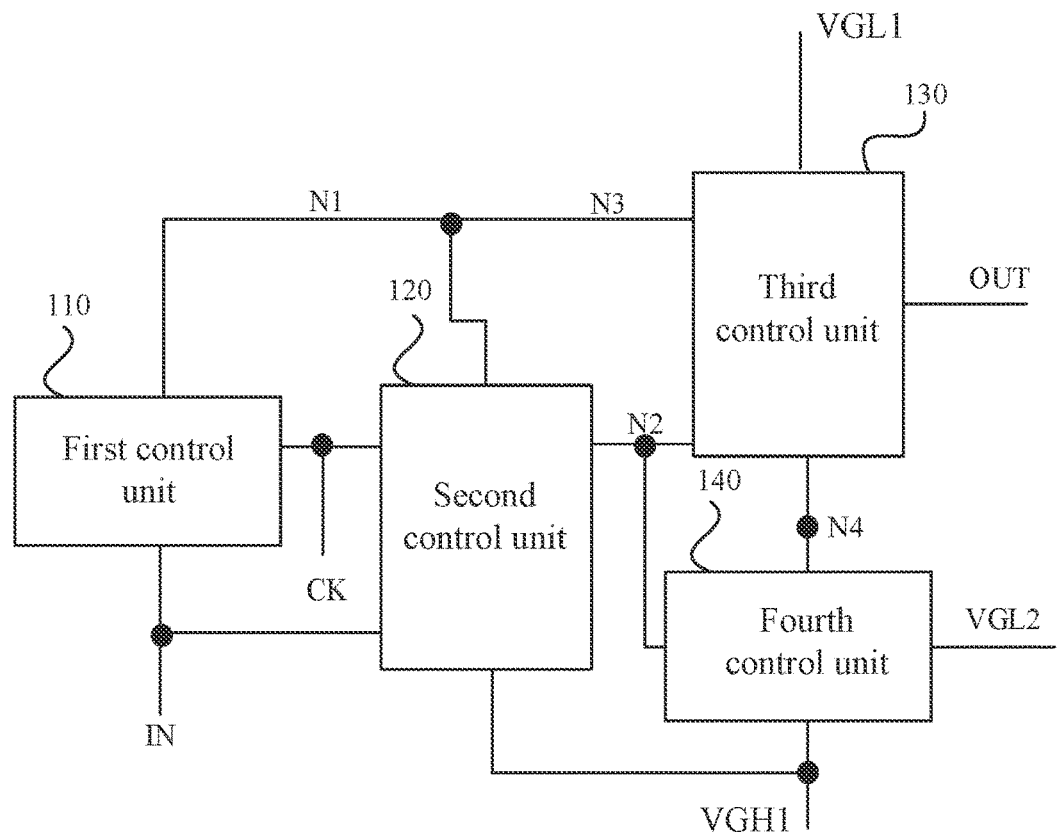
FIG. 4 is a structure diagram of a shift register according to an embodiment of the present disclosure.

FIG. 4 is a structure diagram of a shift register according to an embodiment of the present disclosure. As shown in FIG. 4, the shift register provided in the embodiment of the present disclosure includes a first control unit 110, a second control unit 120, a third control unit 130, and a fourth control unit 140. The first control unit 110 is configured to receive an input signal IN and control a signal of a first node N1 in response to a first clock signal CK. The second control unit 120 is configured to receive a first voltage signal VGH1 and control a signal of a second node N2 in response to at least the input signal IN and the signal of the first node N1. The third control unit 130 is configured to receive a signal of a fourth node N4 and control an output signal in response to the signal of the second node N2, or the third control unit 130 is configured to receive a second voltage signal VGL1 and control the output signal in response to a signal of a third node N3. The third node N3 is connected to the first node N1, the first voltage signal VGH1 is a high level signal, and the second voltage signal VGL1 is a low level signal. The fourth control unit 140 is configured to receive the first voltage signal VGH1 and a third voltage signal VGL2 and control the signal of the fourth node N4 in response to at least the signal of the second node N2, where the third voltage signal VGL2 is a low level signal. When the output signal is a low level signal, a potential of the signal of the fourth node N4 is lower than or equal to a potential of the output signal.

In the embodiment of the present disclosure, the first control unit 110 receives the input signal IN and controls the signal of the first node N1 in response to the first clock signal CK; the second control unit 120 receives the first voltage signal VGH1 and controls the signal of the second node N2 in response to the input signal IN and the signal of the first node N1; the third control unit 130 receives the signal of the fourth node N4 and controls the output signal in response to the signal of the second node N2, or the third control unit 130 receives the second voltage signal VGL1 and controls the output signal in response to the signal of the third node N3. Since a potential of the fourth node N4 affects the output signal, the fourth control unit 140 receives the first voltage signal VGH1 and the third voltage signal VGL2 and controls the signal of the fourth node N4 in response to the signal of the second node N2. In this manner, when the output signal is at a low level, a potential of the signal of the fourth node N4 is lower than or equal to a potential of the output signal, so that the following problem can be avoided: when the output signal is a high level signal, the signal of the fourth node N4 is a high level signal, and when the output signal jumps to a low level, the signal of the fourth node N4 is still maintained as a high level signal, so that the fourth node N4 has a leakage current flowing to an output signal terminal OUT, that is, the high level signal of the fourth node N4 raises the output signal, causing the instable output of the low level signal. When the signal that needs to be output by the output signal terminal is a low level signal, it can be ensured that the signal of the fourth node N4 is lower than or equal to the output signal and is not higher than the output signal, so that when the output signal is a low level signal, the fourth node N4 does not have a leakage current flowing to the output signal terminal OUT, the stability of the output signal can be ensured, and thus the stability of the output signals of the subsequent cascaded shift registers and the display effect of the display panel can be ensured.

Figure 5:
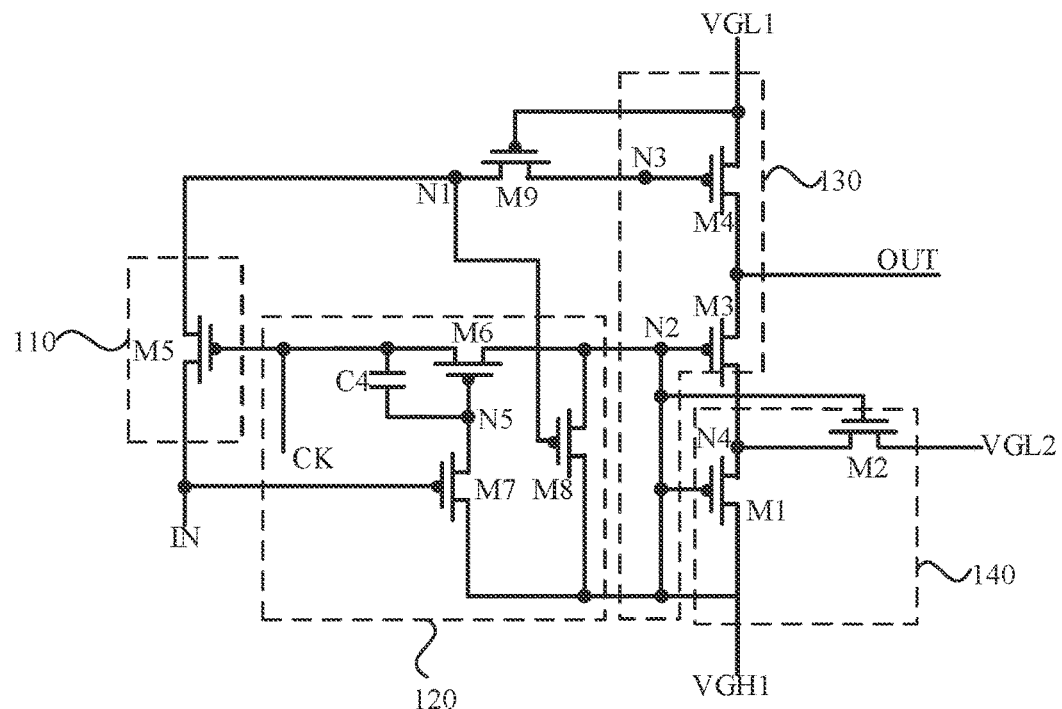
FIG. 5 is a structure diagram of another shift register according to an embodiment of the present disclosure.

In an embodiment, FIG. 5 is a structure diagram of another shift register according to an embodiment of the present disclosure. As shown in FIG. 5, the fourth control unit 140 includes a first transistor M1 and a second transistor M2. One terminal of the first transistor M1 is configured to receive the first voltage signal VGH1, another terminal of the first transistor M1 is connected to the fourth node N4, and a control terminal of the first transistor M1 is connected to the second node N2. One terminal of the second transistor M2 is configured to receive the third voltage signal VGL2, another terminal of the second transistor M2 is connected to the fourth node N4, and a control terminal of the second transistor M2 is connected to the second node N2. That is, the signal of the second node N2 controls the turning on or off of the first transistor M1 and the turning on or off of the second transistor M2. When the first transistor M1 is turned on, the first voltage signal VGH1 is transmitted to the fourth node N4. When the second transistor M2 is turned on, the third voltage signal VGL2 is transmitted to the fourth node N4.

In an embodiment, with continued reference to FIG. 5, the first transistor M1 is a P-type metal oxide semiconductor (PMOS) transistor, and the second transistor M2 is an N-type metal oxide semiconductor (NMOS) transistor; when the signal of the second node N2 is a low level signal, the first transistor M1 is turned on, the second transistor M2 is turned off, and the potential of the fourth node N4 is a high level signal; when the signal of the second node N2 is a high level signal, the first transistor M1 is turned off, the second transistor M2 is turned on, and the potential of the fourth node N4 is a low level signal.

In this embodiment, the type of the first transistor M1 is different from the type of the second transistor M2. When the signal of the second node N2 is a low level signal, the first transistor M1 is turned on, the second transistor M2 is turned off, the first voltage signal VGH1 is transmitted to the fourth node N4, and the potential of the fourth node N4 is a high level signal; when the signal of the second node N2 is a high level signal, the first transistor M1 is turned off, the second transistor M2 is turned on, the third voltage signal VGL2 is transmitted to the fourth node N4, and the potential of the fourth node N4 is a low level signal, that is, the first transistor M1 and the second transistor M2 alternately control the potential of the fourth node N4. In addition, when the second node N2 is at a high level and the output signal is at a low level, the second transistor M2 is turned on, and the third voltage signal VGL2 is transmitted to the fourth node N4. Since the second transistor M2 in this embodiment is an NMOS transistor, in this case, a gate of the second transistor M2 is at a high level (the second node N2 is at a high level), the signal of a source is the third voltage signal VGL2, the potential of a drain is the potential of the fourth node N4, and the second transistor M2 operates in a saturation state. In this manner, the third voltage signal VGL2 may be fully transmitted to the fourth node N4, and the following problem can be avoided: when the second transistor M2 is a PMOS transistor, the fourth node N4 generates a leakage current to the output signal terminal OUT, to affect the stability of the output signal.

In an embodiment, the potential of the third voltage signal VGL2 is lower than or equal to the potential of the first voltage signal VGH1.

As described above, when the first transistor M1 is turned on, the first voltage signal VGH1 is transmitted to the fourth node N4, that is, the potential of the fourth node N4 is the first voltage signal VGH1; when the second transistor M2 is turned on, the third voltage signal VGL2 is transmitted to the fourth node N4, that is, the potential of the fourth node N4 is the third voltage signal VGL2. In this embodiment, when the second voltage signal VGL1 is the same as the third voltage signal VGL2, the signal of the fourth node N4 is the second voltage signal VGL1 and is the same as the output signal; when the third voltage signal VGL2 is lower than the second voltage signal VGL1, the signal of the fourth node N4 is the third voltage signal VGL2 and is lower than the output signal. In this manner, whether the second voltage signal VGL1 is the same as the third voltage signal VGL2 or the third voltage signal VGL2 is lower than the second voltage signal VGL1, it can be avoided that the fourth node N4 generates a leakage current to the output signal terminal OUT, and thus the stability of the output signal can be ensured.

In an embodiment, a width-to-length ratio of a channel region of the first transistor M1 is greater than a width-to-length ratio of a channel region of the second transistor M2.

One terminal of the first transistor M1 receives the first voltage signal VGH1, and another terminal of the first transistor M1 is connected to the fourth node N4. When the output signal is at a high level, the first transistor M1 needs to output the first voltage signal VGH1 to the fourth node N4. The width-to-length ratio of the channel region of the first transistor M1 is set to be larger, so that the output of the first voltage signal VGH1 can be ensured. The second transistor M2 mainly functions to reduce the potential of the fourth node N4 to be equal to or lower than the second voltage signal VGL1 when the output signal is at a low level (the second voltage signal VGL1), for example, the potential of the fourth node N4 is the third voltage signal VGL2. Therefore, the width-to-length ratio of the channel region of the second transistor M2 is set to be smaller, so that the frame space can be saved.

Figure 6:
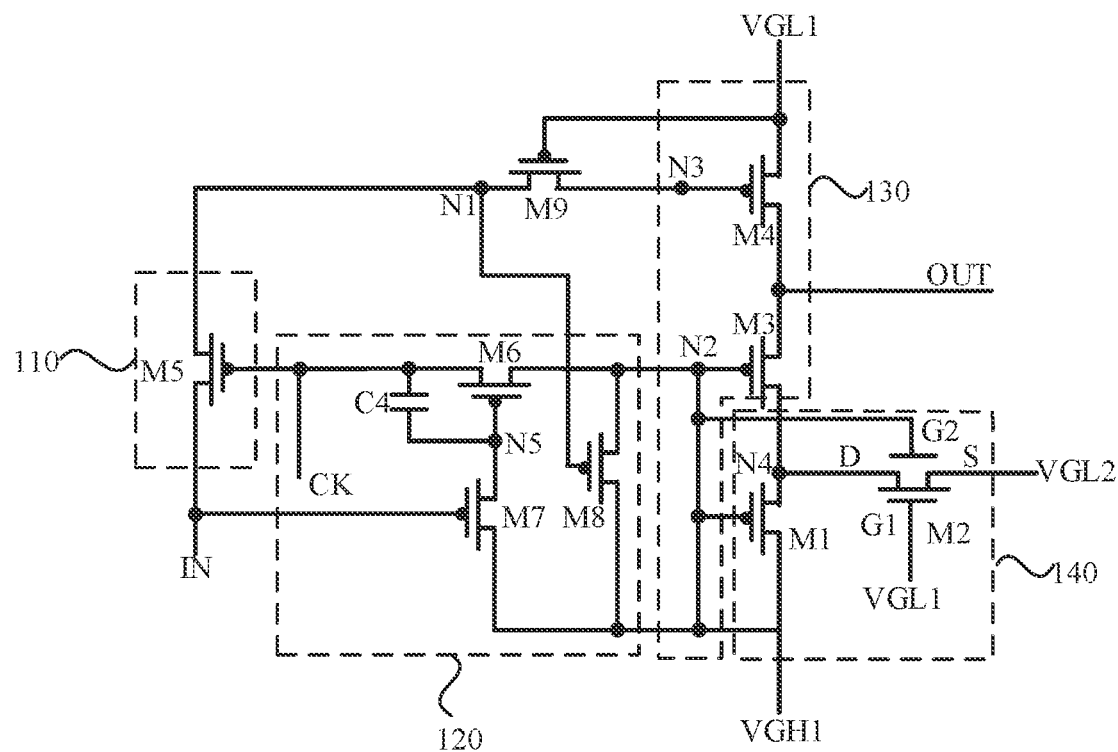
FIG. 6 is a structure diagram of another shift register according to an embodiment of the present disclosure.

In an embodiment, FIG. 6 is a structure diagram of another shift register according to an embodiment of the present disclosure. As shown in FIG. 6, the second transistor M2 includes a second active layer, a second gate G1, a third gate G2, a second source S, and a second drain D. The second gate G1 faces one side surface of the second active layer, and the third gate G2 faces the other side surface of the second active layer. The distance between the second gate G1 and the second active layer is less than the distance between the third gate G2 and the second active layer, that is, the second gate G1 is a primary gate, and the third gate G2 is an auxiliary gate. One of the second gate G1 or the third gate G2 is connected to the second node N2, and the other one of the second gate G1 or the third gate G2 is connected to the second voltage signal VGL1 or the third voltage signal VGL2.

In this embodiment, the second transistor M2 is set as a double-gate transistor, one of the two gates is connected to the second node N2, and the other one of the two gates is connected to the second voltage signal VGL1 or the third voltage signal VGL2. In this manner, the second transistor M2 can be fully turned off when being turned off and the following case can be avoided: when the first transistor M1 is turned on and the second transistor M2 is not fully turned off, the potential (the first voltage signal VGH1) of the fourth node N4 becomes lower, so that the high level signal of the output signal also becomes lower, and thus the stability of the output signal is affected. That is, the second transistor M2 is set as a double-gate transistor, and one of the two gates is connected to a fixed potential. In this manner, when the first transistor M1 is turned on, the second transistor M2 can be fully turned off, so that the potential of the fourth node N4 is not affected.

In an embodiment, with continued reference to FIG. 6, the second node N2 is connected to the third gate G2, and the second gate G1 receives the second voltage signal VGL1 or the third voltage signal VGL2.

Considering that the second gate G1 is the primary gate and the third gate G2 is the auxiliary gate, the value of the threshold voltage of the second gate G1 is less than the value of the threshold voltage of the third gate G2. If the signal of the control terminal of the second gate G1 is unstable, the off state of the second transistor M2 is affected, and thus the potential of the fourth node N4 is affected. Therefore, in this embodiment, to ensure that the signal of the fourth node N4 is a high level signal when the second transistor M2 is turned off, that is, when the second node N2 is a low level signal, the second node N2 is connected to the third gate G2 with a greater threshold voltage when the source of the second transistor M2 receives the third voltage signal VGL2. In this manner, it is relatively difficult for the potential fluctuation of the second node N2 to affect the off state of the second transistor M2, so that the second transistor M2 can be fully turned off. In this manner, the following case can be avoided: the potential fluctuation of the second node N2 causes the second transistor M2 to be turned on, causing the signal of the fourth node N4 to become lower, to cause the high level signal of the output signal to become lower.

That is, the second transistor M2 is set as an NMOS type and double-gate transistor, the primary gate receives a fixed potential (the second voltage signal VGL1 or the third voltage signal VGL2), and the auxiliary gate is connected to the second node N2. In this manner, the second transistor M2 can be fully turned on when being turned on, and the potential of the fourth node N4 is sufficiently low, so that when the output signal is a low level signal, the fourth node N4 does not have a leakage current flowing to the output signal terminal OUT, and thus the stability of the output signal can be ensured; moreover, the second transistor M2 can be fully turned off when being turned off, so that the influence of the low level on the signal (the first voltage signal VGH1) of the fourth node N4 can be avoided.

Figure 7:
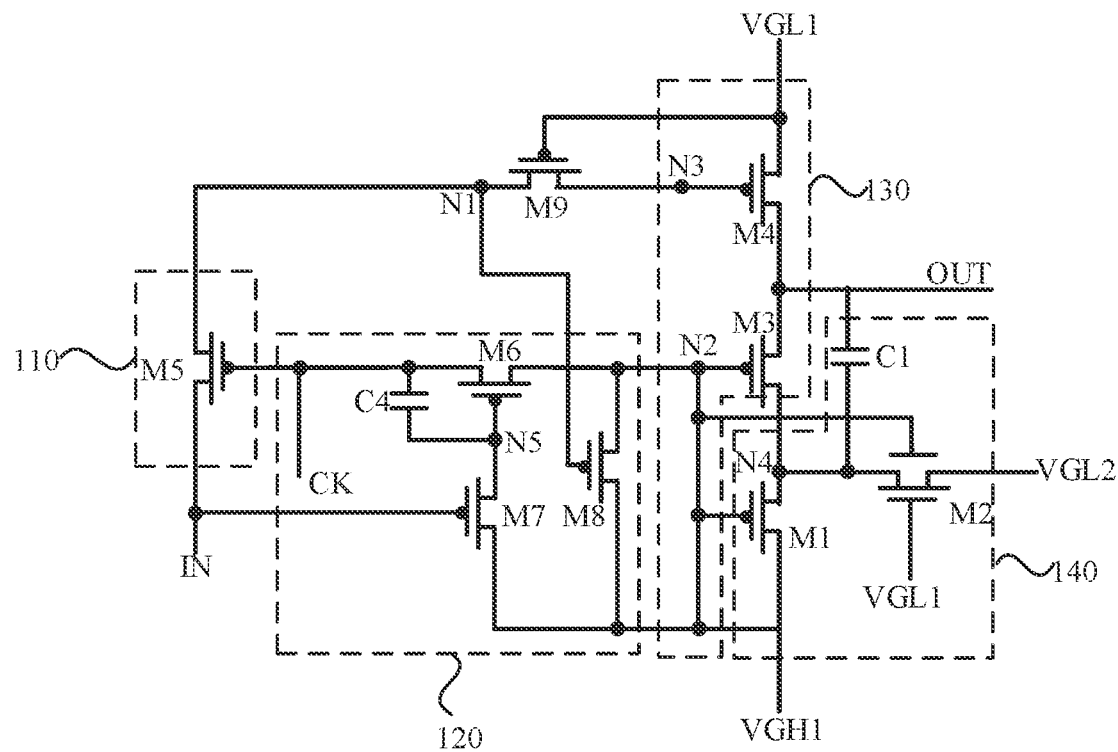
FIG. 7 is a structure diagram of another shift register according to an embodiment of the present disclosure.

In an embodiment, FIG. 7 is a structure diagram of another shift register according to an embodiment of the present disclosure. As shown in FIG. 7, the fourth control unit 140 further includes a first capacitor C1, a first electrode plate of the first capacitor C1 is connected to the fourth node N4, and a second electrode plate of the first capacitor C1 is connected to the output signal terminal OUT.

It is considered that the timing sequence of the potential of the fourth node N4 is the same as the timing sequence of the potential of the signal output by the output signal terminal OUT, that is, when the fourth node N4 is at a low level, the signal output by the output signal terminal OUT is also at a low level; and when the fourth node N4 is at a high level, the signal output by the output signal terminal OUT is also at a high level. Therefore, in this embodiment, the first capacitor C1 is connected between the fourth node N4 and the output signal terminal OUT. In this manner, when the fourth node N4 is at a low level, the low level signal output by the output signal terminal OUT can further pull down the potential of the fourth node N4, so that a leakage current from the fourth node N4 toward the output signal terminal OUT can be prevented from being generated, and the stability of the output signal of the output signal terminal OUT can be ensured.

Figure 8:
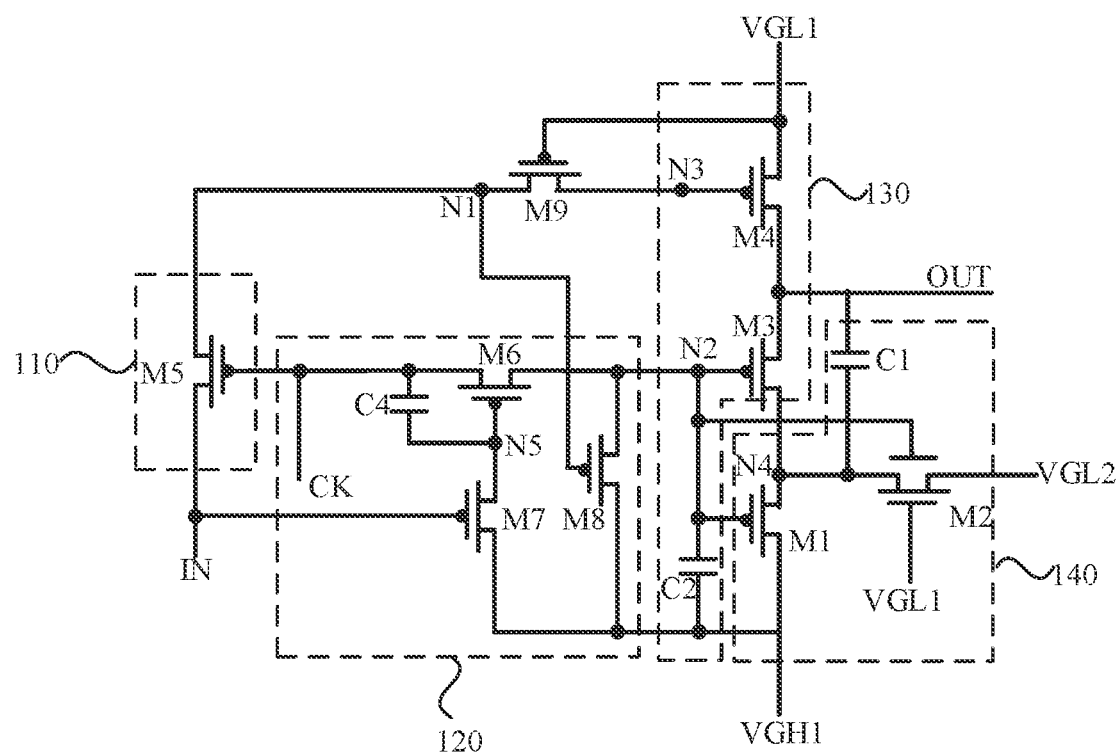
FIG. 8 is a structure diagram of another shift register according to an embodiment of the present disclosure.

In an embodiment, FIG. 8 is a structure diagram of another shift register according to an embodiment of the present disclosure. As shown in FIG. 8, the third control unit 130 further includes a second capacitor C2, a first electrode plate of the second capacitor C2 is configured to receive the first voltage signal VGH1, and a second electrode plate of the second capacitor C2 is connected to the second node N2. The capacitance value of the second capacitor C2 is greater than the capacitance value of the first capacitor C1.

In the capacitance formula $C=Q/U$, C denotes the capacitance, Q denotes the amount of charge, and U denotes the voltage. According to the capacitance formula, it can be seen that when the amount of charge Q is constant, the greater the capacitance C is, the smaller the voltage U is. Therefore, in this embodiment, the second capacitor C2 is disposed between the first voltage signal VGH1 and the second node N2, and the capacitance value of the second capacitor C2 is larger. In this manner, it can be ensured that the potential of the second node N2 does not easily fluctuate, and thus the effect of stabilizing the potential of the second node N2 can be achieved. The first capacitor C1 is configured to pull down the potential of the fourth node N4. According to the preceding capacitance formula, the capacitance value of the first capacitor C1 may be set to be smaller, so that when the amount of charge Q is constant, the change of the voltage U changes is more obvious, and thus the effect of pulling down the potential of the fourth node N4 can be achieved.

Figure 9:
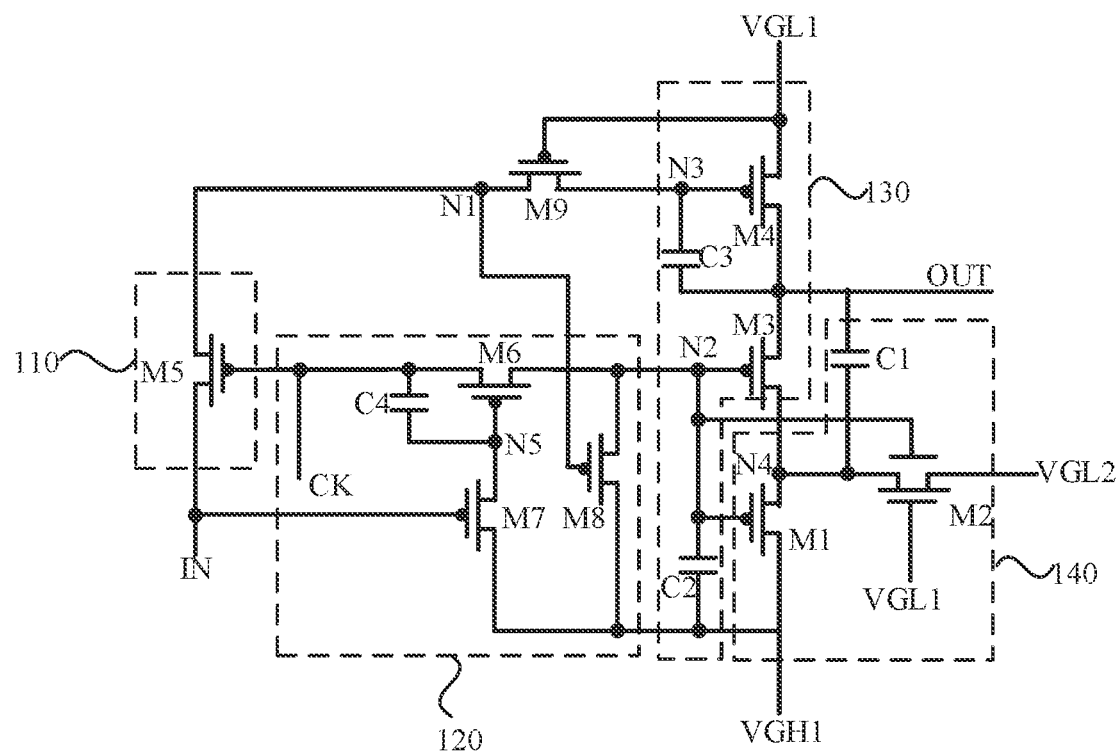
FIG. 9 is a structure diagram of another shift register according to an embodiment of the present disclosure.

In an embodiment, FIG. 9 is a structure diagram of another shift register according to an embodiment of the present disclosure. As shown in FIG. 9, the third control unit 130 further includes a third capacitor C3, a first electrode plate of the third capacitor C3 is connected to the output signal terminal OUT, and a second electrode plate of the third capacitor C3 is connected to the third node N3. The capacitance value of the third capacitor C3 is greater than the capacitance value of the first capacitor C1.

Similarly, in the capacitance formula $C=Q/U$, C denotes the capacitance, Q denotes the amount of charge, and U denotes the voltage. According to the capacitance formula, when the amount of charge Q is constant, the greater the capacitance C is, the smaller the voltage U is. Therefore, in this embodiment, the third capacitor C3 is disposed between the output signal terminal OUT and the third node N3, and the capacitance value of the third capacitor C3 is relatively great. In this manner, it can be ensured that the potential of the third node N3 does not easily fluctuate, and thus the effect of stabilizing the potential of the third node N3 can be achieved. The first capacitor C1 is configured to pull down the potential of the fourth node N4. According to the preceding capacitance formula, the capacitance value of the first capacitor C1 may be set to be smaller, so that when the amount of charge Q is constant, the change of the voltage U is more obvious, and thus the effect of pulling down the potential of the fourth node N4 can be achieved.

In an embodiment, as shown in FIGS. 5 to 9, the third control unit 130 includes a third transistor M3 and a fourth transistor M4. One terminal of the third transistor M3 is connected to the fourth node N4, another terminal of the third transistor M3 is connected to the output signal terminal OUT, and a control terminal of the third transistor M3 is connected to the second node N2. One terminal of the fourth transistor M4 is configured to receive the second voltage signal VGL1, another terminal of the fourth transistor M4 is connected to the output signal terminal OUT, and a control terminal of the fourth transistor M4 is connected to the third node N3. That is, the signal of the second node N2 controls the turning on or off of the third transistor M3, and when the third transistor M3 is turned on, the signal of the fourth node N4 is transmitted to the output signal terminal OUT; the signal of the third node N3 controls the turning on or off of the fourth transistor M4, and when the fourth transistor M4 is turned on, the second voltage signal VGL1 is transmitted to the output signal terminal OUT.

In an embodiment, a channel region of a transistor, whose channel region has a larger width-to-length ratio among the third transistor M3 and the fourth transistor M4, has a larger width-to-length ratio than a channel region of a transistor, whose channel region has a larger width-to-length ratio among the first transistor M1 and the second transistor M2.

The third transistor M3 and the fourth transistor M4 are connected to the output signal terminal OUT, the third transistor M3 mainly functions to transmit the first voltage signal VGH1 to the output signal terminal OUT, and the fourth transistor M4 mainly functions to transmit the second voltage signal VGL1 to the output signal terminal OUT. Therefore, in this embodiment, the width-to-length ratio of the channel region of the third transistor M3 and the width-to-length ratio of the channel region of the fourth transistor M4 are set to be larger, so that a better output effect can be achieved. The function of the first transistor M1 and the function of the second transistor M2 are mainly to control the potential of the fourth node N4. Therefore, the width-to-length ratio of the channel region of the first transistor M1 and the width-to-length ratio of the channel region of the second transistor M2 may be set to be smaller, so that the frame area can be saved.

In an embodiment, the width-to-length ratio of the channel region of any one of the third transistor M3 or the fourth transistor M4 is greater than the width-to-length ratio of the channel region of any one of the first transistor M1 or the second transistor M2.

In an embodiment, the width-to-length ratio of the channel region of the first transistor M1 is R1, the width-to-length ratio of the channel region of the second transistor M2 is R2, the width-to-length ratio of the channel region of the third transistor M3 is R3, the width-to-length ratio of the channel region of the four transistor M4 is R4, and $R3 \geq R1 > R4 > R2$.

One terminal of the third transistor M3 receives the first voltage signal VGH1 and transmits the first voltage signal VGH1 to the output signal terminal OUT, and one terminal of the fourth transistor M4 receives the second voltage signal VGL1 and transmits the second voltage signal VGL1 to the output signal terminal OUT. In this embodiment, if the driving circuit 10 is a light emission control circuit, the driving circuit 10 provides a signal for a light emission control signal terminal in the pixel circuit, and if a light emission control transistor in the pixel circuit is a PMOS transistor, the second voltage signal VGL1 is an active signal of the light emission control transistor. To ensure that the PMOS transistor is turned off when the first voltage signal VGH1 is output and to avoid problems such as light leakage in the pixel circuit, the width-to-length ratio R3 of the channel region of the third transistor M3 may be appropriately increased, so that the output capability of the first voltage signal VGH1 can be ensured; the width-to-length ratio R1 of the channel region of the first transistor M1 may be equal to or less than the width-to-length ratio R3 of the channel region of the third transistor M3, the width-to-length ratio R4 of the channel region of the fourth transistor M4 may be appropriately smaller, and the width-to-length ratio R2 of the channel region of the second transistor M2 may be appropriately further smaller. In this manner, the space occupied by each transistor can be reasonably allocated according to the performance, and thus the frame area can be saved under the premise of ensuring the performance of the driving circuit 10.

Based on any one of the preceding embodiments, in an embodiment, as shown in FIGS. 5 to 9, the first control unit 110 includes a fifth transistor M5, one terminal of the fifth transistor M5 is configured to receive the input signal IN, another terminal of the fifth transistor M5 is connected to the first node N1, and a control terminal of the fifth transistor M5 is configured to receive the first clock signal CK. The second control unit 120 includes a sixth transistor M6, a seventh transistor M7, an eight transistor M8, and a fourth capacitor C4. One terminal of the sixth transistor M6 is configured to receive the first clock signal CK, another terminal of the sixth transistor M6 is connected to the second node N2, and a control terminal of the sixth transistor M6 is connected to the fifth node N5. One terminal of the seventh transistor M7 is connected to the fifth node N5, another terminal of the seventh transistor M7 is configured to receive the first voltage signal VGH1, and a control terminal of the seventh transistor M7 is configured to receive the input signal IN. One terminal of the eighth transistor M8 is connected to the second node N2, another terminal of the eighth transistor M8 is configured to receive the first voltage signal VGH1, and a control terminal of the eighth transistor M8 is connected to the first node N1. A first electrode plate of the fourth capacitor C4 is configured to receive the first clock signal CK, and a second electrode plate of the fourth capacitor C4 is connected to the fifth node N5.

It is to be noted that, in embodiments of the present disclosure, only one connection manner of the source and drain of a transistor is used as an example for description, and it is not limited to this. In other embodiments, the connection manner of the source and drain of any transistor may be interchangeable and will not be repeated herein.

The operating process of the shift register shown in FIG. 9 will be described below in conjunction with the timing sequence diagram of signals in the shift register. The timing sequence of the signal in the shift register of other structures is basically the same as this and will not be repeated herein.

Figure 10:
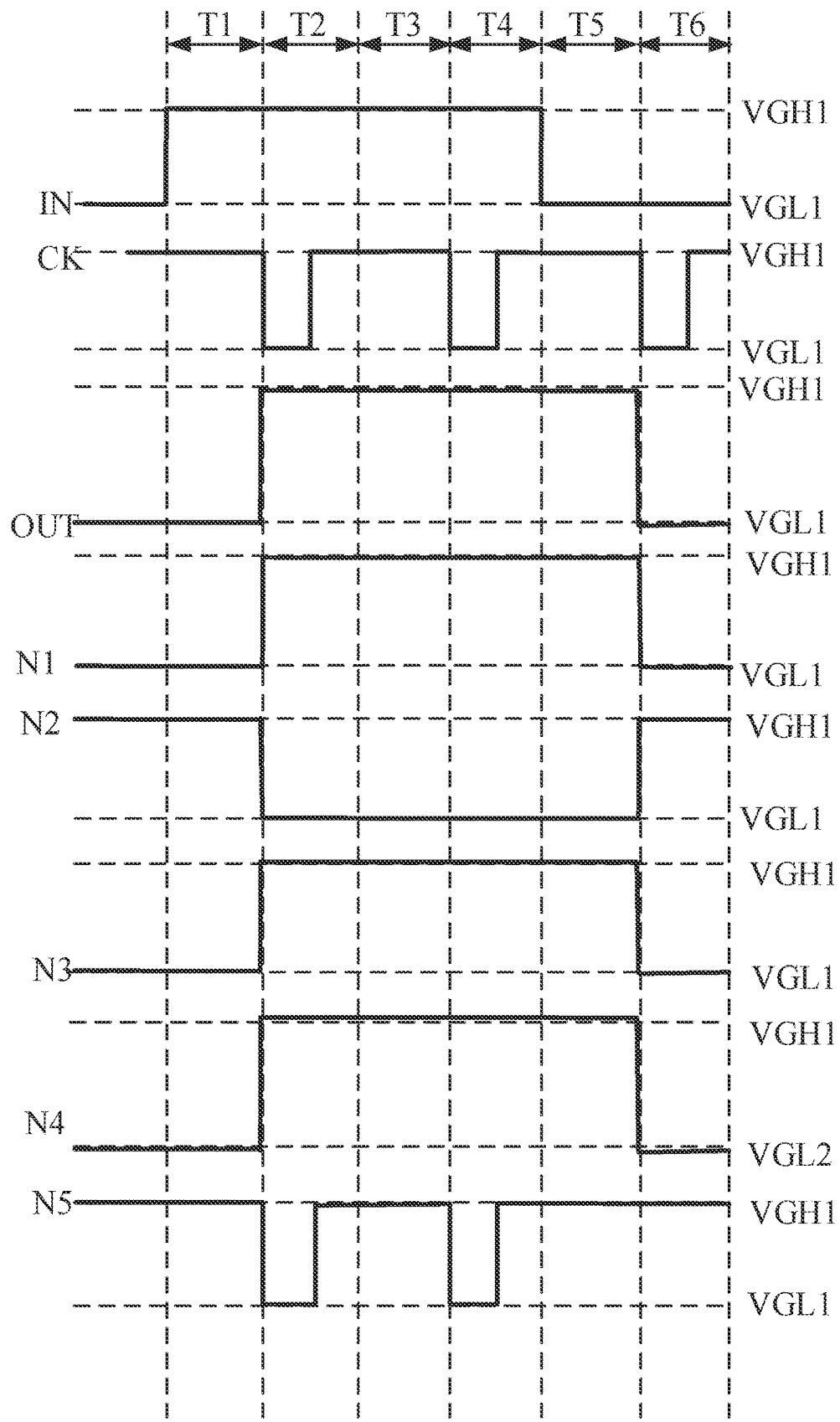
FIG. 10 is a timing sequence diagram of node signals of a shift register according to an embodiment of the present disclosure.

For example, FIG. 10 is a timing sequence diagram of node signals of a shift register according to an embodiment of the present disclosure. As shown in FIG. 10, in a T1 stage, the input signal IN is at a high level, the first clock signal CK is at a high level, the fifth transistor M5 and the seventh transistor M7 are turned off, the fifth node N5 is maintained at a high level, the first node N1 is maintained at a low level, the eighth transistor M8 is turned on, and the first voltage signal VGH1 is transmitted to the second node N2. In this manner, the second node N2 is at a high level, the first transistor M1 and the third transistor M3 are turned off, the second transistor M2 is turned on, and the third voltage signal VGL2 is transmitted to the fourth node N4, so that the fourth node N4 is at a low level. Since the ninth transistor M9 is normally on, and the level of the third node N3 and the level of the first node N1 are the same and are both at a low level, the fourth transistor M4 is turned on, the second voltage signal VGL1 is transmitted to the signal output terminal OUT, and thus the signal output by the output terminal OUT is at a low level.

In a T2 stage, the input signal IN is at a high level, the first clock signal CK is at a low level, the fifth transistor M5 is turned on, and the input signal IN is transmitted to the first node N1, so that the first node N1 is at a high level, the third node N3 is at a high level, and the fourth transistor M4 is turned off; under the action of the fourth capacitor C4, the fifth node N5 is at a low level, the sixth transistor M6 is turned on, and the first clock signal CK is transmitted to the second node N2. In this manner, the second node N2 is at a low level, the first transistor M1 and the third transistor M3 are turned on, the second transistor M2 is turned off, and the first voltage signal VGH1 is transmitted to the fourth node N4, so that the fourth node N4 is at a high level, the turned-on second transistor M2 transmits the first voltage signal VGH1 to the signal output terminal OUT, and thus the signal output by the signal output terminal OUT is at a high level.

In a T3 stage, the input signal IN is at a high level, and the first clock signal CK is at a high level; under the action of the fourth capacitor C4, the fifth node N5 is at a high level, the fifth transistor M5 is turned off, the first node N1 is maintained at a high level, the third node N3 is maintained at a high level, the sixth transistor M6 and the eighth transistor M8 are turned off, the second node N2 is maintained at a low level, the first transistor M1 and the third transistor M3 are kept on, and the first voltage signal VGH1 is transmitted to the fourth node N4, so that the fourth node N4 is at a high level; the second transistor M2 is kept off, so that the signal output by the signal output terminal OUT is at a high level.

In a T4 stage, the input signal IN is at a high level, the first clock signal CK is at a low level, the fifth transistor M5 is turned on, and the input signal IN is transmitted to the first node N1, so that the first node N1 is maintained at a high level, and the third node N3 is maintained at a high level; under the action of the fourth capacitor C4, the fifth node N5 is at a low level, the sixth transistor M6 is turned on, and the first clock signal CK is transmitted to the second node N2. In this manner, the second node N2 is maintained at a low level, the first transistor M1 and the third transistor M3 are kept on, and the first voltage signal VGH1 is transmitted to the fourth node N4, so that the fourth node N4 is at a high level; the second transistor M2 is kept off, so that the signal output by the signal output terminal OUT is at a high level.

In a T5 stage, the input signal IN is at a low level, the first clock signal CK is at a high level, the fifth transistor M5 is turned off, the first node N1 is maintained at a high level, the third node N3 is maintained at a high level, the seventh transistor M7 is turned on, and the first voltage signal VGH1 is transmitted to the fifth node N5. In this manner, the fifth node N5 is at a high level, so that the second node N2 is maintained at a low level, the first transistor M1 and the third transistor M3 are kept on, the first voltage signal VGH1 is transmitted to the fourth node N4, and thus the fourth node N4 is at a high level; the second transistor M2 is kept off, so that the signal output by the signal output terminal OUT is at a high level.

In a T6 stage, the input signal IN is at a low level, the first clock signal CK is at a low level, and the fifth transistor M5 and the seventh transistor M7 are turned on; the turned-on fifth transistor M5 transmits the input signal IN to the first node N1, so that the first node N1 is at a low level, the third node N3 is at a low level; the turned-on seventh transistor M7 transmits the first voltage signal VGH1 to the fifth node N5, so that the fifth node N5 is at a high level, the sixth transistor M6 is turned off; and the turned-on eighth transistor M8 transmits the first voltage signal VGH1 to the second node N2, so that the second node N2 is at a high level, the first transistor M1 and the third transistor M3 are turned off, the second transistor M2 is turned on, the third voltage signal VGL2 is transmitted to the fourth node N4, and thus the fourth node N4 is at a low level. Since the third node N3 is at a low level, the fourth transistor M4 is turned on; and the second voltage signal VGL1 is transmitted to the signal output terminal OUT, so that the signal output by the signal output terminal OUT is at a low level.

When the signal output by the signal output terminal OUT is at a low level (the second voltage signal VGL1), the potential (the third voltage signal VGL2) of the fourth node N4 is lower than or equal to the potential of the signal output by the signal output terminal OUT. Therefore, the fourth node N4 does not have a leakage current flowing to the output signal terminal OUT, so that the stability of the output signal can be ensured, and thus the stability of the output signals of the subsequent cascaded shift registers and the display effect of the display panel can be ensured.

In an embodiment, with continued reference to FIG. 3, the display panel further includes signal lines electrically connected to the driver chip 20, where the signal lines may include, for example, a first clock signal line LCK, a first voltage signal line LVGH1, a second voltage signal line LVGL1, and a third voltage signal line LVGL2. The first clock signal line LCK is configured to provide the first clock signal CK for the driving circuit 10, the first voltage signal line LVGH1 is configured to provide the first voltage signal VGH1 for the driving circuit 10, the second voltage signal line LVGL1 is configured to provide the second voltage signal VGL1 for the driving circuit 10, and the third voltage signal line LVGL2 is configured to provide the third voltage signal VGL2 for the driving circuit 10.

The first voltage signal VGH1 and the second voltage signal VGL1 are configured to generate output signals, and the output signals are configured to provide drive signals for the pixel circuits 31 of the display area AA of the display panel. Therefore, to save the space of the driving circuit 10 as much as possible and to avoid excessively long wiring, the first voltage signal line LVGH1 and the second voltage signal line LVGL1 may be disposed on one side closer to the display area AA.

Figure 11:
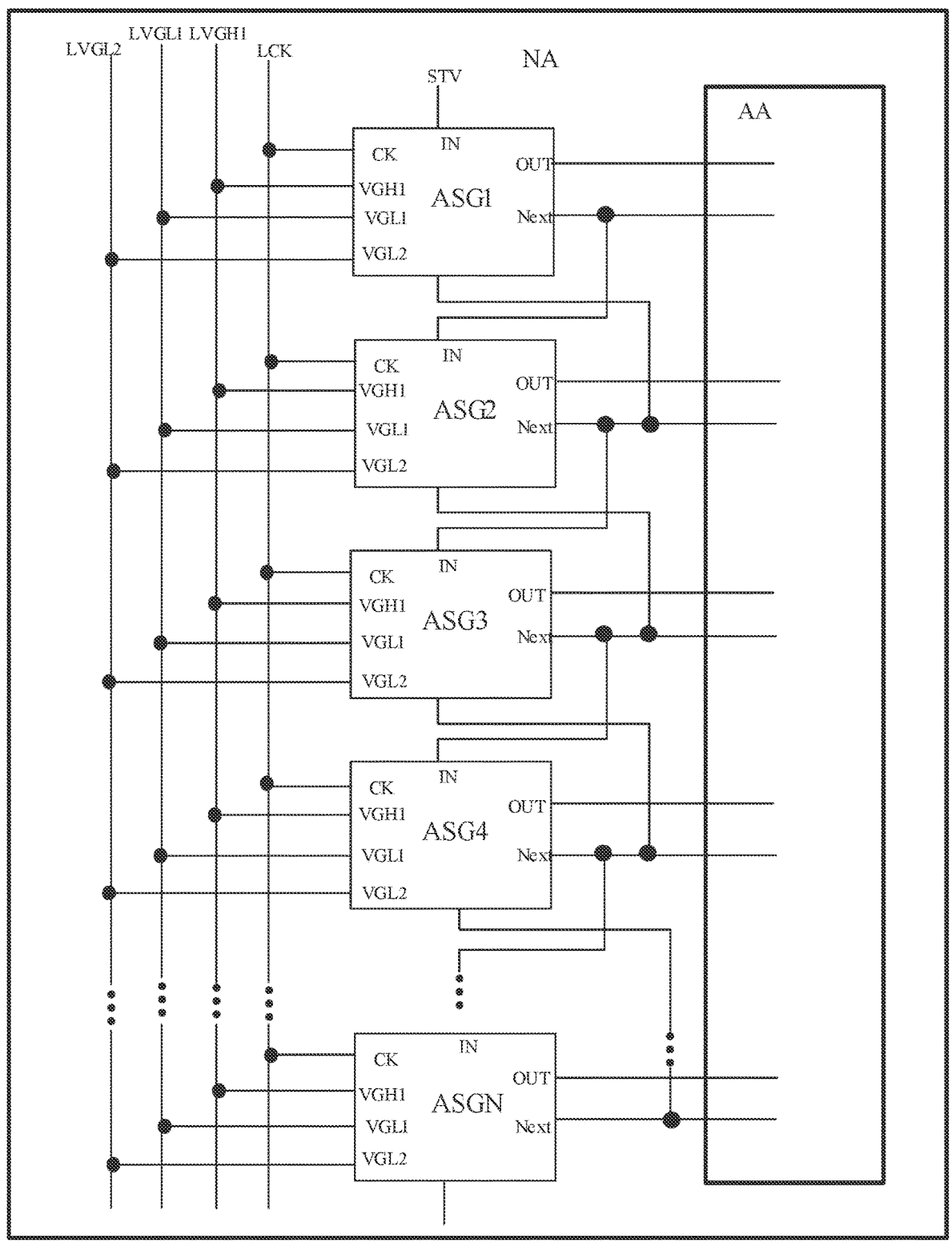
FIG. 11 is a structure diagram of another driving circuit according to an embodiment of the present disclosure.

Based on this, in some embodiments of the present disclosure, at least one of the first voltage signal line LVGH1 or the second voltage signal line LVGL1 is located on one side of the third voltage signal line LVGL2 facing the display area AA of the display panel as shown in FIG. 11.

In an embodiment, with continued reference to FIG. 11, the first voltage signal line LVGH1, the second voltage signal line LVGL1, and the third voltage signal line LVGL2 are all located on one side of the driving circuit facing away from the display area AA of the display panel. In addition, the first voltage signal line LVGH1 and the second voltage signal line LVGL1 are both located on one side of the third voltage signal line LVGL2 closer to the display area AA or facing the display area AA of the display panel, so that the space saving of the driving circuit 10 can be maximized, and the wiring length can be reduced.

Figure 12:
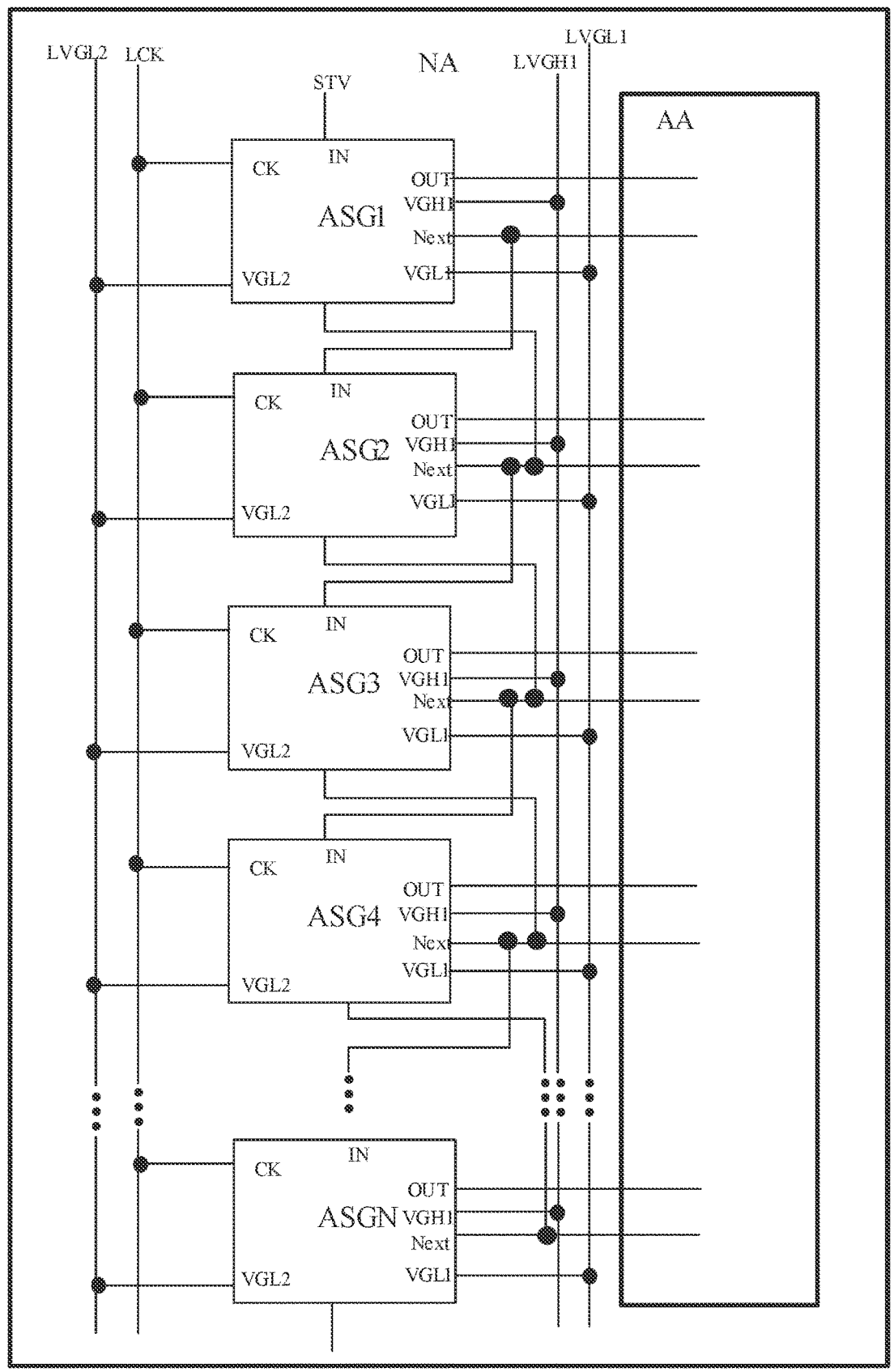
FIG. 12 is a structure diagram of another driving circuit according to an embodiment of the present disclosure.

Of course, the present disclosure is not limited to this. In other embodiments, as shown in FIG. 12, FIG. 12 is a structure diagram of another driving circuit according to an embodiment of the present disclosure. The third voltage signal line LVGL2 is located on one side of the driving circuit facing away from the display area AA of the display panel, and the first voltage signal line LVGH1 and the second voltage signal line LVGL1 are located on one side of the driving circuit facing the display area AA of the display panel, so that the space of the driving circuit 11 can be further saved, and the wiring length can be reduced.

Since the potential of the third voltage signal VGL2 is lower than or equal to the potential of the second voltage signal VGL1, the voltage value carried on the second voltage signal line LVGL1 is relatively great. If the line width of the second voltage signal line LVGL1 is relatively small, the resistance is relatively great, and the voltage loss on the second voltage signal line LVGL1 is relatively great. Therefore, in some embodiments of the present disclosure, the line width of the second voltage signal line LVGL1 is greater than the line width of the third voltage signal line LVGL2.

Figure 13:
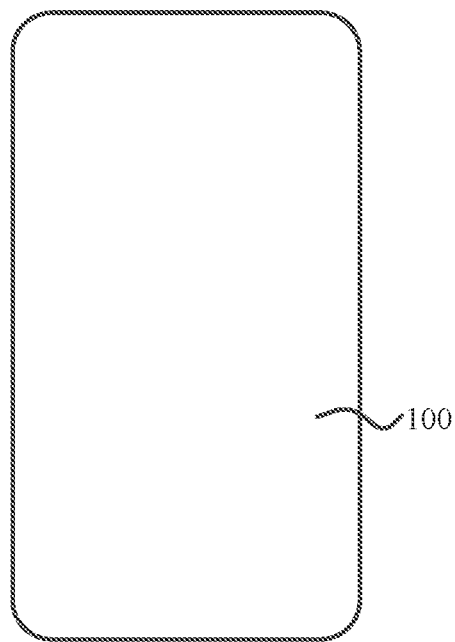
FIG. 13 is a structure diagram of a display device according to an embodiment of the present disclosure.

Based on the same inventive concept, an embodiment of the present disclosure further provides a display device. The display device includes any display panel provided in the preceding embodiments. For example, as shown in FIG. 13, a display device 110 includes a display panel 100. Therefore, the display device also has the beneficial effects of the display panel described in the preceding embodiments, and for the same details, reference may be made to the description of the preceding display panel, and repetition will not made herein.

The display device 110 provided in the embodiment of the present disclosure may be the phone shown in FIG. 13, or may be any electronic product with a display function, including but not limited to the following categories: televisions, laptops, desktop displays, tablet computers, digital cameras, smart bracelets, smart glasses, in-vehicle displays, industry-controlling equipment, medical displays, and touch interactive terminals, which will not be specifically limited in embodiments of the present disclosure.

What is claimed is:

1. A display panel, comprising:
a driving circuit comprising N stages of cascaded shift registers, wherein N≥2, and each of the N stages of cascaded shift registers comprises:
a first control unit, which is configured to receive an input signal and control a signal of a first node in response to a first clock signal;
a second control unit, which is configured to receive a first voltage signal and control a signal of a second node in response to at least the input signal and the signal of the first node;
a third control unit, which is configured to receive a signal of a fourth node and control an output signal in response to the signal of the second node, or receive a second voltage signal and control an output signal in response to a signal of a third node, wherein the third node is connected to the first node, the first voltage signal is a high level signal, and the second voltage signal is a low level signal; and
a fourth control unit, which is configured to receive the first voltage signal and a third voltage signal, and control the signal of the fourth node in response to at least the signal of the second node, wherein the third voltage signal is a low level signal;
wherein in a case where the output signal is a low level signal, a potential of the signal of the fourth node is lower than or equal to a potential of the output signal.

2. The display panel of claim 1, wherein the fourth control unit comprises a first transistor and a second transistor, wherein one terminal of the first transistor is configured to receive the first voltage signal, another terminal of the first transistor is connected to the fourth node, and a control terminal of the first transistor is connected to the second node; and one terminal of the second transistor is configured to receive the third voltage signal, another terminal of the second transistor is connected to the fourth node, and a control terminal of the second transistor is connected to the second node.

3. The display panel of claim 2, wherein the first transistor is a P-type metal oxide semiconductor (PMOS) transistor, and the second transistor is an N-type metal oxide semiconductor (NMOS) transistor;
in a case where the signal of the second node is a low level signal, the first transistor is turned on, the second transistor is turned off, and a potential of the fourth node is a high level signal; and
in a case where the signal of the second node is a high level signal, the first transistor is turned off, the second transistor is turned on, and the potential of the fourth node is a low level signal.

4. The display panel of claim 3, wherein a potential of the third voltage signal is lower than or equal to a potential of the first voltage signal.

5. The display panel of claim 3, wherein the second transistor comprises a second active layer, a second gate, a third gate, a second source, and a second drain, the second gate faces one side surface of the second active layer, and the third gate faces the other side surface of the second active layer;

a distance between the second gate and the second active layer is less than a distance between the third gate and the second active layer; and one of the second gate or the third gate is connected to the second node, and the other one of the second gate or the third gate is connected to the second voltage signal or the third voltage signal.

6. The display panel of claim 5, wherein the second node is connected to the third gate, and the second gate receives the second voltage signal or the third voltage signal.

7. The display panel of claim 3, wherein a width-to-length ratio of a channel region of the first transistor is greater than a width-to-length ratio of a channel region of the second transistor.

8. The display panel of claim 2, wherein the fourth control unit further comprises a first capacitor, wherein a first electrode plate of the first capacitor is connected to the fourth node, and a second electrode plate of the first capacitor is connected to an output signal terminal.

9. The display panel of claim 8, wherein the third control unit further comprises a second capacitor, wherein a first electrode plate of the second capacitor is configured to receive the first voltage signal, and a second electrode plate of the second capacitor is connected to the second node, wherein a capacitance value of the second capacitor is greater than a capacitance value of the first capacitor.

10. The display panel of claim 8, wherein the third control unit further comprises a third capacitor, wherein a first electrode plate of the third capacitor is connected to an output signal terminal, and a second electrode plate of the third capacitor is connected to the third node; and a capacitance value of the third capacitor is greater than a capacitance value of the first capacitor.

11. The display panel of claim 3, wherein the third control unit comprises a third transistor and a fourth transistor, wherein one terminal of the third transistor is connected to the fourth node, another terminal of the third transistor is connected to an output signal terminal, and a control terminal of the third transistor is connected to the second node; and one terminal of the fourth transistor is configured to receive the second voltage signal, another terminal of the fourth transistor is connected to the output signal terminal, and a control terminal of the fourth transistor is connected to the third node.

12. The display panel of claim 11, wherein a channel region of a transistor, whose channel region has a larger width-to-length ratio among the third transistor and the fourth transistor, has a larger width-to-length ratio than a channel region of a transistor, whose channel region has a larger width-to-length ratio among the first transistor and the second transistor.

13. The display panel of claim 11, wherein one of a width-to-length ratio of a channel region of the third transistor or a width-to-length ratio of a channel region of the fourth transistor is greater than one of a width-to-length ratio of a channel region of the first transistor or a width-to-length ratio of a channel region of the second transistor.

14. The display panel of claim 11, wherein
a width-to-length ratio of a channel region of the first transistor is R1;
a width-to-length ratio of a channel region of the second transistor is R2;
a width-to-length ratio of a channel region of the third transistor is R3;
a width-to-length ratio of a channel region of the fourth transistor is R4; and
R3≥R1>R4>R2.

15. The display panel of claim 1, wherein
the first control unit comprises:
a fifth transistor, wherein one terminal of the fifth transistor is configured to receive the input signal, another terminal of the fifth transistor is connected to the first node, and a control terminal of the fifth transistor is configured to receive the first clock signal; and the second control unit comprises:
a sixth transistor, wherein one terminal of the sixth transistor is configured to receive the first clock signal, another terminal of the sixth transistor is connected to the second node, and a control terminal of the sixth transistor is connected to a fifth node;
a seventh transistor, wherein one terminal of the seventh transistor is connected to the fifth node, another terminal of the seventh transistor is configured to receive the first voltage signal, and a control terminal of the seventh transistor is configured to receive the input signal;
an eighth transistor, wherein one terminal of the eighth transistor is connected to the second node, another terminal of the eighth transistor is configured to receive the first voltage signal, and a control terminal of the eighth transistor is connected to the first node; and
a fourth capacitor, wherein a first electrode plate of the fourth capacitor is configured to receive the first clock signal, and a second electrode plate of the fourth capacitor is connected to the fifth node.

16. A display device, comprising
a display panel, wherein the display panel comprises a driving circuit comprising N stages of cascaded shift registers, wherein N≥2, and each of the N stages of cascaded shift registers comprises:
a first control unit, which is configured to receive an input signal and control a signal of a first node in response to a first clock signal;
a second control unit, which is configured to receive a first voltage signal and control a signal of a second node in response to at least the input signal and the signal of the first node;
a third control unit, which is configured to receive a signal of a fourth node and control an output signal in response to the signal of the second node, or receive a second voltage signal and control an output signal in response to a signal of a third node, wherein the third node is connected to the first node, the first voltage signal is a high level signal, and the second voltage signal is a low level signal; and
a fourth control unit, which is configured to receive the first voltage signal and a third voltage signal, and control the signal of the fourth node in response to at least the signal of the second node, wherein the third voltage signal is a low level signal;
wherein in a case where the output signal is a low level signal, a potential of the signal of the fourth node is lower than or equal to a potential of the output signal.

17. The display device of claim 16, wherein the fourth control unit comprises a first transistor and a second transistor, wherein one terminal of the first transistor is configured to receive the first voltage signal, another terminal of the first transistor is connected to the fourth node, and a control terminal of the first transistor is connected to the second node; and one terminal of the second transistor is configured to receive the third voltage signal, another terminal of the second transistor is connected to the fourth node, and a control terminal of the second transistor is connected to the second node.

18. The display device of claim 17, wherein the first transistor is a P-type metal oxide semiconductor (PMOS) transistor, and the second transistor is an N-type metal oxide semiconductor (NMOS) transistor;
   in a case where the signal of the second node is a low level signal, the first transistor is turned on, the second transistor is turned off, and a potential of the fourth node is a high level signal; and
   in a case where the signal of the second node is a high level signal, the first transistor is turned off, the second transistor is turned on, and the potential of the fourth node is a low level signal.

19. The display device of claim 18, wherein a potential of the third voltage signal is lower than or equal to a potential of the first voltage signal.

20. The display device of claim 18, wherein the second transistor comprises a second active layer, a second gate, a third gate, a second source, and a second drain, the second gate faces one side surface of the second active layer, and the third gate faces the other side surface of the second active layer;
   a distance between the second gate and the second active layer is less than a distance between the third gate and the second active layer; and
   one of the second gate or the third gate is connected to the second node, and the other one of the second gate or the third gate is connected to the second voltage signal or the third voltage signal.

* * * * *